United States Patent [19]

Oh et al.

[11] Patent Number: 5,369,312
[45] Date of Patent: Nov. 29, 1994

[54] HOT CARRIER PROTECTION CIRCUIT

[75] Inventors: Jong H. Oh; Hong S. Kim, both of Ichonkun, Rep. of Korea

[73] Assignee: Hyundai Electronics Industries Co., Ltd., Ichonkun, Rep. of Korea

[21] Appl. No.: 958,645

[22] Filed: Oct. 8, 1992

[30] Foreign Application Priority Data

Oct. 8, 1991 [KR] Rep. of Korea ............... 1991/17645

[51] Int. Cl.$^5$ ............................................. H01L 27/06
[52] U.S. Cl. ................................. 327/545; 257/355
[58] Field of Search .................. 307/290, 296.5, 304, 307/359, 491, 458, 302, 571; 361/94; 257/339, 355, 356

[56] References Cited

U.S. PATENT DOCUMENTS 4,687,954 8/1987 Yasuda et al. .................... 307/359
4,740,713 4/1988 Sakurai et al. .................. 307/296.5
5,175,445 12/1992 Kinugasa et al. .................. 307/290

FOREIGN PATENT DOCUMENTS 2060253 3/1987 Japan ................................. 257/355
3100764 5/1988 Japan ................................. 257/355
2180068 7/1990 Japan ................................. 257/355

Primary Examiner—Timothy P. Callahan
Assistant Examiner—Dinh Le
Attorney, Agent, or Firm—Darby & Darby

[57] ABSTRACT

A hot carrier protection circuit comprises two transistors of the same size which are serially arranged and a third transistor for precharging a node which connects the other two transistors. The third transistor has its source coupled to the source of one of the two transistors, a drain coupled to the drain of the same transistor while its gate is coupled to a power source Vcc.

1 Claim, 2 Drawing Sheets

HOT CARRIER PROTECTION CIRCUIT

FIELD OF THE INVENTION

The present invention relates to an Integrated Circuit, and more particularly to a hot carrier protection circuit used in an integrated circuit such as a short channel device.

BACKGROUND OF THE INVENTION

Recently, in VLSI circuits, a very large of short channel devices have been used increasingly, and thus it is required to provide an improved hot carrier protection circuit for preventing hot carrier generation from degrading reliability of such devices.

In the conventional hot carrier protection circuit as shown in FIG. 1, for the purpose of hot carrier protection, two transistors Q1 and Q2 are serially arranged. In FIG. 1, because voltage applied to the circuit is divided by resistance values of the respective transistors Q1 and Q2, voltage appeared at node Na connecting two transistors (see FIG. 1) is to reduced by voltage corresponding to the resistance value of the transistor Q1. However, to avoid hot carrier generation, voltage appeared at node Na should be below power source voltage Vcc. Therefore, width of the transistor Q1 should be two-three times of that of the transistor Q2, because current driven by the transistors Q1 and Q2 is constant.

Referring to FIG. 2, in the case that the transistor Q1 operates in saturation mode and the transistor Q2 operates in linear mode, saturation current is equal to linear current. This is represented by following equation.

$$K1/2 \times (nW)(Vgs-Vtq1) = K1/2 \times W[2(Vgs-Vtq2)Va - Va]n(Vgs-Vtq1) = 2(Vgs-Vtq2)Va - Va$$

wherein supposing that
Vpp=Vcc+3 Vtqn(i.e. all threshold voltages of transistors used are equal)
Vcc=5 volts and
vtqn=0.7 volts $$0 = Va - 2(4.3)Va + 4.3n$$

if n=1, then, Va=1.57
thus, Vpp−Va>Vcc
wherein,
Vpp: Positive Pumping Voltage
Va: Voltage at node Na
Vtqn: Threshold Voltage of Transistor
W: Width of Transistor Q2
nW: Width of Transistor Q1
n: Integer (1,2,3, . . . )
K1: Parameter (K1=(u×Eins×Eo)/(D×L)
u: Electron Mobility
Eins: Relative Permittivity of Insulation between gate and channel
Eo: Permittivity of free space
D: Dielectric thickness of gate of Transistor
L: Channel length of Transistor
Vgs: Gate-Source Voltage of Transistor Therefore, in the conventional hot carries protection circuit, to achieve hot carrier protection, the width of the transistor Q1 should be two-three times of that of the transistor Q2. Accordingly, there is a problem that Layout area of the transistor Q1 should be enlarged.

OBJECT OF THE INVENTION

It is an object of the invention to provide a hot carrier protection circuit having small Layout area by means of precharge scheme.

DETAILED DESCRIPTION OF THE INVENTION

Figure 1:
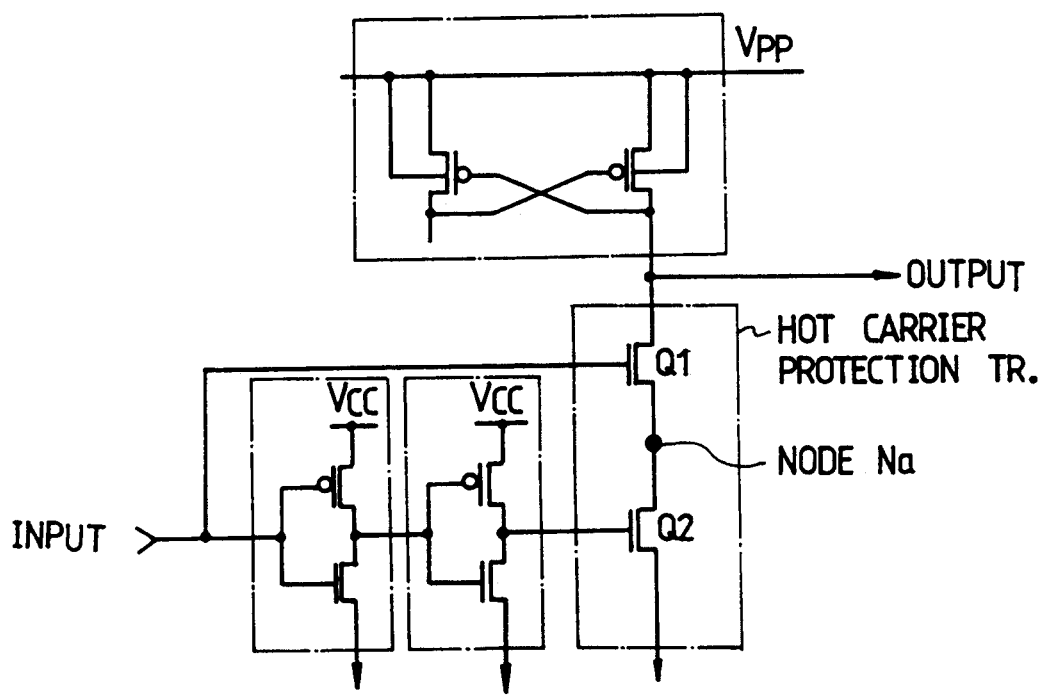
FIG. 1 illustrates an example of an integrated circuit comprising a conventional hot carrier protection circuit.
Figure 2:
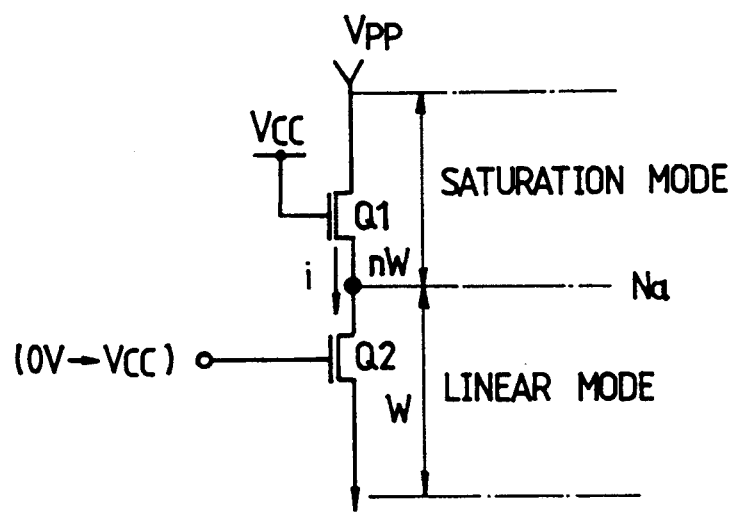
FIG. 2 illustrates an equivalent circuit of the pilot hot carrier protection circuit.
Figure 3:
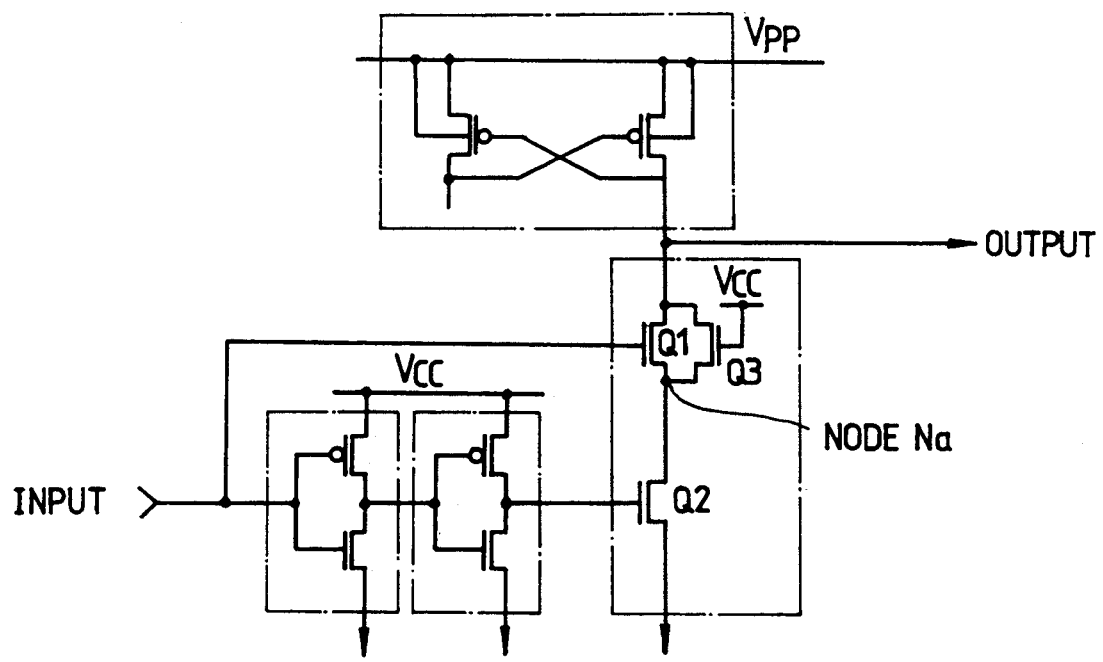
FIG. 3 illustrates an example of an integrated circuit comprising a hot carrier protection circuit according to the invention.

Now referring to FIG. 3, a hot carrier protection circuit according to the invention comprises two same size transistors Q1 and Q2 serially arranged and a transistor Q3 for precharging a node Na connecting the two transistors. The transistor Q3 has a source connected to the source of the transistor Q1, a drain coupled to the drain of the transistor Q1 and a gate connected to a power source Vcc. In FIG. 3, the node Na is precharged by voltage Vcc−Vtq1. Therefore, voltage Va between the source and drain of the transistor Q1 is obtained as follows:

$$Va = Vpp - Vcc - Vtq1$$

Wherein supposing that Vpp=Vcc+3 Vtq1 and Vtq1 is equal to about 0.7 volts, then, when Vcc is equal to 5 volts, voltage Va become 1.4 volts. Accordingly, although the size of the transistor Q1 is equal to that of the transistor Q2, the hot carrier protection circuit according to the invention performs a function of hot carrier protection effectively. Also, because node Na connecting the transistors Q1 and Q2 is precharged at all times, damages to transistors are reduced. Therefore, device with high reliability can be obtained.

We claim:

1. In a hot carrier protection circuit for an array of MOSFET devices including at least one MOSFET having a source terminal connected to a power source $V_{cc}$, said protection circuit being of the type including first and second MOSFETs which are connected in series for the purpose of preventing hot carrier generation wherein the gates of said first and second MOSFETs are connected to two different points of said array of MOSFET devices, the improvement comprising:

said first and second MOSFETs being of the same size; and a third MOSFET for precharging a node $N_a$ connecting said first and second MOSFETs, said third MOSFET having its source and drain respectively coupled to a source and drain of said first MOSFET other than said node Na, said first MOSFET having one of its terminals connected as an output node of said first and second MOSFETs, a gate of said third MOSFET coupled to said $V_{cc}$ power source, whereby said node $N_a$ is maintained at a voltage lower than $V_{cc}$ in magnitude.

* * * * *